(12) United States Patent
Tseng et al.

(10) Patent No.: US 8,969,213 B2
(45) Date of Patent: Mar. 3, 2015

(54) NON-LITHOGRAPHIC LINE PATTERN FORMATION

(75) Inventors: Chiahsun Tseng, Wynantskill, NY (US); David V. Horak, Essex Junction, VT (US); Chun-chen Yeh, Clifton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 13/561,122

(22) Filed: Jul. 30, 2012

(65) Prior Publication Data

US 2014/0027917 A1    Jan. 30, 2014

(51) Int. Cl.
*H01L 21/308*    (2006.01)

(52) U.S. Cl.
USPC ........... 438/734; 438/597; 438/608; 438/720; 438/768

(58) Field of Classification Search
CPC ..................... H01L 21/76823; H01L 21/76825
USPC ................................................. 438/768, 785
See application file for complete search history.

(56) References Cited

U.S. PATENT DOCUMENTS

| | | |
|---|---|---|
| 7,473,644 B2 | 1/2009 | Lane et al. |
| 8,003,542 B2 | 8/2011 | Sant et al. |
| 8,012,674 B2 | 9/2011 | Fischer et al. |
| 8,119,535 B2 | 2/2012 | Tran et al. |
| 8,143,156 B2 | 3/2012 | Matamis et al. |
| 8,158,476 B2 | 4/2012 | Tran et al. |
| 2005/0277206 A1* | 12/2005 | Gaidis et al. .................... 438/3 |
| 2006/0202300 A1* | 9/2006 | Visokay et al. ............... 257/506 |
| 2008/0166878 A1 | 7/2008 | Li et al. |
| 2010/0055917 A1* | 3/2010 | Kim ............................. 438/706 |

* cited by examiner

*Primary Examiner* — Colleen A Matthews
*Assistant Examiner* — William Harriston
(74) *Attorney, Agent, or Firm* — Scully, Scott, Murphy & Presser, P.C.; Yuanmin Cai

(57) ABSTRACT

A metal layer is deposited over an underlying material layer. The metal layer includes an elemental metal that can be converted into a dielectric metal-containing compound by plasma oxidation and/or nitridation. A hard mask portion is formed over the metal layer. Plasma oxidation or nitridation is performed to convert physically exposed surfaces of the metal layer into the dielectric metal-containing compound. The sequence of a surface pull back of the hard mask portion, trench etching, another surface pull back, and conversion of top surfaces into the dielectric metal-containing compound are repeated to form a line pattern having a spacing that is not limited by lithographic minimum dimensions.

20 Claims, 13 Drawing Sheets

NON-LITHOGRAPHIC LINE PATTERN FORMATION

BACKGROUND

The present disclosure relates to a method of patterning a structure, and more particularly to a non-lithographic method of patterning a structure employing successive mask erosion, and structures formed by the same.

Semiconductor device scaling has been limited by the limitations of lithographic tools. For example, dimensions of minimum printable features have been limited by the capabilities of available lithographic tools to print such features. The slow progress in the capabilities of lithographic tools in recent years has made it difficult to aggressively scale the pitch of line level patterns near critical dimensions.

SUMMARY

A metal layer is deposited over an underlying material layer. The metal layer includes an elemental metal that can be converted into a dielectric metal-containing compound by plasma oxidation and/or nitridation. A hard mask portion is formed over the metal layer. Plasma oxidation and/or nitridation is performed to convert physically exposed surfaces of the metal layer into the dielectric metal-containing compound. Surface portions of the hard mask portion are pulled back to physically expose surfaces of the metal layer, and trenches are formed through the metal layer in the newly exposed area. Additional surface portions of the hard mask portion are pulled back, and physically exposed top surfaces of the metal layer are converted into the dielectric metal-containing compound. The sequence of a surface pull back of the hard mask portion, trench etching, another surface pull back, and conversion of top surfaces into the dielectric metal-containing compound are repeated to form a line pattern having a spacing that is not limited by lithographic minimum dimensions.

According to an aspect of the present disclosure, a method of forming a lithographic structure is provided. A metal layer is formed on an underlying material layer. A hard mask portion is formed on the metal layer. A first surface portion of the metal layer is converted into a dielectric metal-containing compound portion employing the hard mask portion as a masking structure. A top surface of a second surface portion of the metal layer is physically exposed by isotropically recessing physically exposed surfaces of the hard mask portion. An outer periphery of the second surface portion coincides with an inner periphery of the dielectric metal-containing compound portion.

According to another aspect of the present disclosure, a patterned structure is provided, which includes a patterned layer located on an underlying material layer. The patterned layer includes a first stack including a first metal portion and a first dielectric metal-containing compound portion contacting a top surface of the first metal portion. The patterned layer further includes a second stack including a second metal portion and a second dielectric metal-containing compound portion overlying a peripheral portion of the second metal portion. Outer sidewalls of the second stack are laterally spaced from inner sidewalls of the first stack by a same distance throughout an entire periphery of the second stack.

DETAILED DESCRIPTION

Figure 1A:
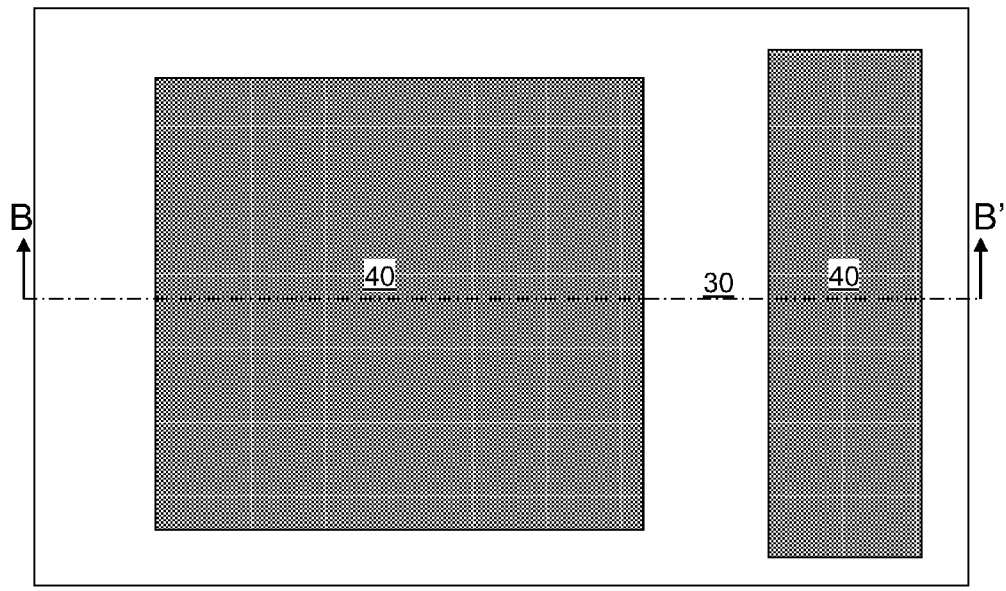
FIG. 1A is a top-down view of an exemplary structure after formation of a metal layer and patterned hard mask portions according to an embodiment of the present disclosure.

As stated above, the present disclosure relates to a non-lithographic method of patterning a structure employing successive mask erosion, and structures formed by the same. Aspects of the present disclosure are now described in detail with accompanying figures. It is noted that like reference numerals refer to like elements across different embodiments. The drawings are not necessarily drawn to scale.

Figure 1B:
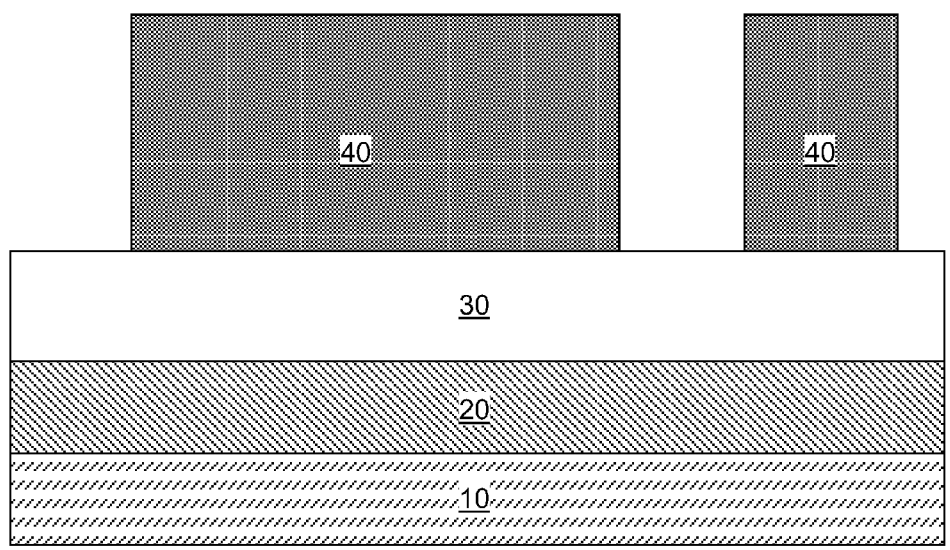
FIG. 1B is a vertical cross-sectional view of the exemplary structure along the vertical plane B-B' of FIG. 1A.

Referring to FIGS. 1A and 1B, an exemplary structure according to an embodiment of the present disclosure comprises an optional handle substrate 10 and an underlying material layer 20 located on the handle substrate 10. The optional handle substrate 10, if present, can include a dielectric material, a conductive material, a semiconductor material, or a combination thereof. The optional handle substrate 10 can provide mechanical support to the underlying material layer 20.

The underlying material layer 20 can include a semiconductor material, a dielectric material, a conductive material, or a combination thereof. The underlying material layer 20 may include a material different from, or the same as, the material of the optional handle substrate 10. For example, the underlying material layer 20 can include a single crystalline semiconductor material or a polycrystalline semiconductor material, and the optional handle substrate 10 can include a dielectric material or a semiconductor material different from the semiconductor material of the underlying material layer 20.

A metal layer 30 can be formed on a top surface of the underlying material layer 20. The metal layer 30 includes a metal that can be converted into a metal-containing compound. In one embodiment, the metal containing compound can be a dielectric metal containing oxide, a dielectric metal-containing nitride, or a dielectric metal-containing oxynitride. In one embodiment, the metal layer 30 can include an elemental metal. Non-limiting examples of the elemental metal include aluminum, tantalum, titanium, tungsten, hafnium, zirconium, chromium, copper, zinc, iron, cobalt, and nickel.

In one embodiment, the metal layer includes at least one elemental metal that can be converted into a dielectric metal-containing oxide. Elemental metals that can be converted into a dielectric metal-containing oxide include, but are not limited to, aluminum, tantalum, titanium, tungsten, hafnium, zirconium, chromium, copper, zinc, iron, cobalt, and nickel.

In another embodiment, the metal layer includes at least one elemental metal that can be converted into a dielectric metal-containing nitride. Elemental metals that can be converted into a dielectric metal-containing nitride include, but are not limited to, aluminum, tantalum, titanium, tungsten, hafnium, zirconium, chromium, copper, zinc, iron, cobalt, and nickel.

The metal layer 30 can be deposited by physical vapor deposition (PVD), chemical vapor deposition (CVD), electroplating, electroless plating, or combinations thereof. The thickness of the metal layer 30 can be, for example, from 10 nm to 300 nm, although lesser and greater thicknesses can also be employed. The metal layer 30 can be deposited as a blanket layer having a same thickness throughout.

A hard mask layer is deposited over the metal layer 30. The hard mask layer includes a dielectric material such as silicon oxide, silicon nitride, silicon oxynitride, a dielectric metal oxide, or combinations thereof. Examples of the dielectric metal oxide that can be employed for the hard mask layer include, but are not limited to, hafnium oxide, zirconium oxide, tantalum oxide, and titanium oxide. The hard mask layer can be deposited by chemical vapor deposition (CVD), atomic layer deposition (ALD), or any other known methods for depositing silicon oxide, silicon nitride, silicon oxynitride, and/or the dielectric metal oxide. The hard mask layer can be deposited as a blanket having a same thickness throughout. The thickness of the hard mask layer can be from 30 nm to 1,000 nm, although lesser and greater thicknesses can also be employed.

The hard mask layer is lithographically patterned to form hard mask portions 40. Specifically, a photoresist layer (not shown) is applied over the top surface of the hard mask layer, and is subsequently lithographically patterned to form photoresist portions that cover discrete areas over the hard mask layer. The pattern in the photoresist portions can be transferred into the hard mask layer by an anisotropic etch. The remaining portions of the hard mask layer constitute the hard mask portions 40. The photoresist portions can be subsequently removed selective to the hard mask portions 40 and the metal layer 30, for example, by ashing.

A surface portion of the metal layer 30 is physically exposed within an area in which the hard mask portions 40 are not present. As used herein, a "surface portion" refers to a portion of a structure that is located directly beneath a physically exposed surface of a structure and not extending to surface of the structure that is located on an opposite side of the physically exposed surface. The surface portion of the metal layer 30 that is physically exposed at this step is herein referred to as a first surface portion.

Figure 2A:
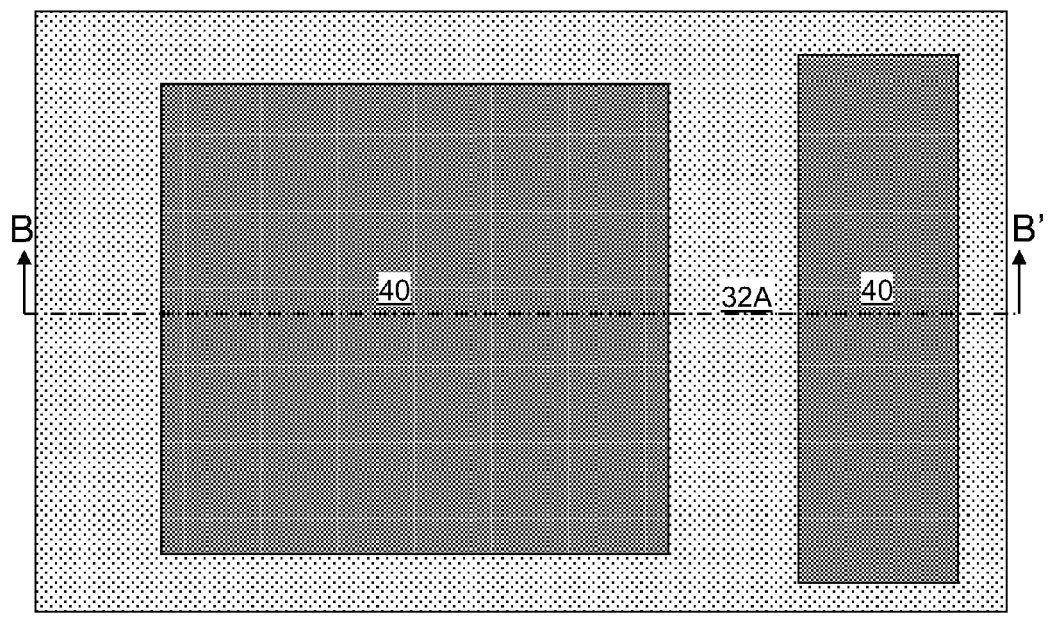
FIG. 2A is a top-down view of the exemplary structure after formation of a dielectric metal-containing compound portions according to an embodiment of the present disclosure.
Figure 2B:
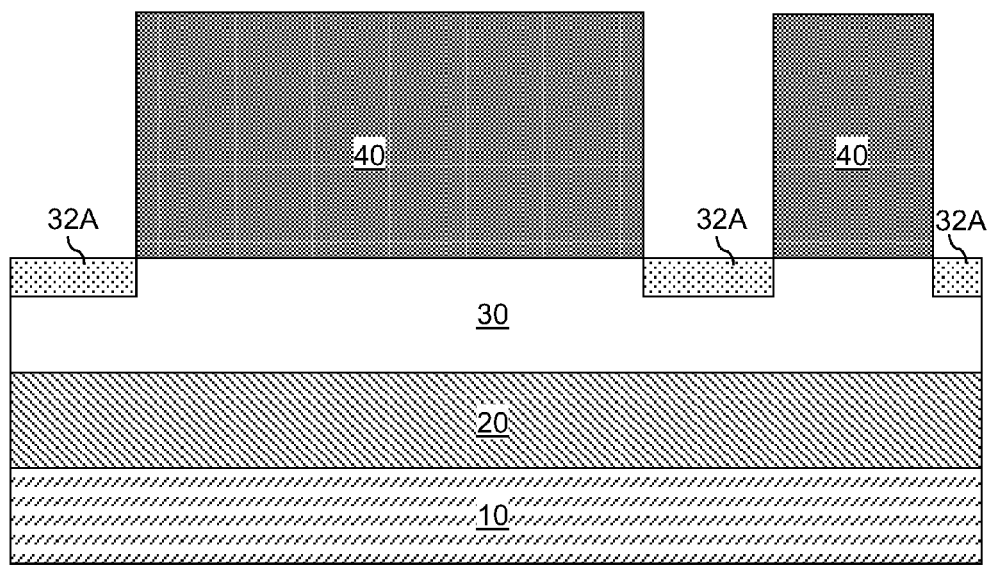
FIG. 2B is a vertical cross-sectional view of the exemplary structure along the vertical plane B-B' of FIG. 2A.

Referring to FIGS. 2A and 2B, the first surface portion of the metal layer 30 is converted into a dielectric metal-containing compound portion, which is herein referred to as a first dielectric metal-containing compound portion 32A. The conversion of the first surface portion of the metal layer 30 into the first dielectric metal-containing compound portion 32A can be performed employing a plasma conversion process. The hard mask portions 40 can be employed as masking structures that mask the portions of the metal layer 30 underneath the hard mask portions 40 from conversion into a dielectric metal-containing compound material.

In one embodiment, the conversion of the first surface portion of the metal layer 30 into the first dielectric metal-containing compound portion 32A can be performed by plasma oxidation, in which an oxygen-containing plasma oxidizes the first surface portion of the metal layer 30 into a metal oxide material. The plasma oxidation can employ a plasma of oxygen or ozone within a pressure range from 0.1 mTorr to 10 mTorr, although lesser and greater pressures can also be employed. The first dielectric metal-containing compound portion 32A includes an oxide of the metal of the metal layer 30. The thickness of the first dielectric metal-containing compound portion 32A is determined by the energy of the oxygen-containing plasma and duration of the plasma oxidation process, and can be from 0.6 nm to 10 nm, although lesser and greater thicknesses can also be employed. For example, if the metal of the metal layer 30 is aluminum, the dielectric metal-containing compound can be aluminum oxide. If the metal of the metal layer 30 is a transition metal, the dielectric metal-containing compound can be a transition metal oxide.

In another embodiment, the conversion of the first surface portion of the metal layer 30 into the first dielectric metal-containing compound portion 32A can be performed by plasma nitridation, in which a nitrogen-containing plasma nitridates the first surface portion of the metal layer 30 into a metal nitride material. The plasma nitridation can employ a plasma of nitrogen or ammonia within a pressure range from 0.1 mTorr to 10 mTorr, although lesser and greater pressures can also be employed. The first dielectric metal-containing compound portion 32A includes a nitride of the metal of the metal layer 30. The thickness of the first dielectric metal-containing compound portion 32A is determined by the energy of the nitrogen-containing plasma and duration of the plasma nitridation process, and can be from 0.6 nm to 10 nm, although lesser and greater thicknesses can also be employed. For example, if the metal of the metal layer 30 is aluminum, the dielectric metal-containing compound can be aluminum nitride. If the metal of the metal layer 30 is a transition metal, the dielectric metal-containing compound can be a transition metal nitride.

In yet another embodiment, the conversion of the first surface portion of the metal layer 30 into the first dielectric metal-containing compound portion 32A can be performed by plasma oxynitridation, in which a plasma containing oxygen and nitrogen converts the first surface portion of the metal layer 30 into a metal oxynitride material. The plasma oxynitridation can employ a plasma of an oxidizing species and a nitridating species within a pressure range from 0.1 mTorr to 10 mTorr, although lesser and greater pressures can also be employed. The oxidizing species can be at least one of oxygen and ozone, and the nitridating species can be at least one of nitrogen and ammonia. The first dielectric metal-containing compound portion 32A includes an oxynitride of the metal of the metal layer 30. The thickness of the first dielectric metal-containing compound portion 32A is determined by the energy of the plasma and duration of the plasma oxynitridation process, and can be from 0.6 nm to 10 nm, although lesser and greater thicknesses can also be employed.

Figure 3A:
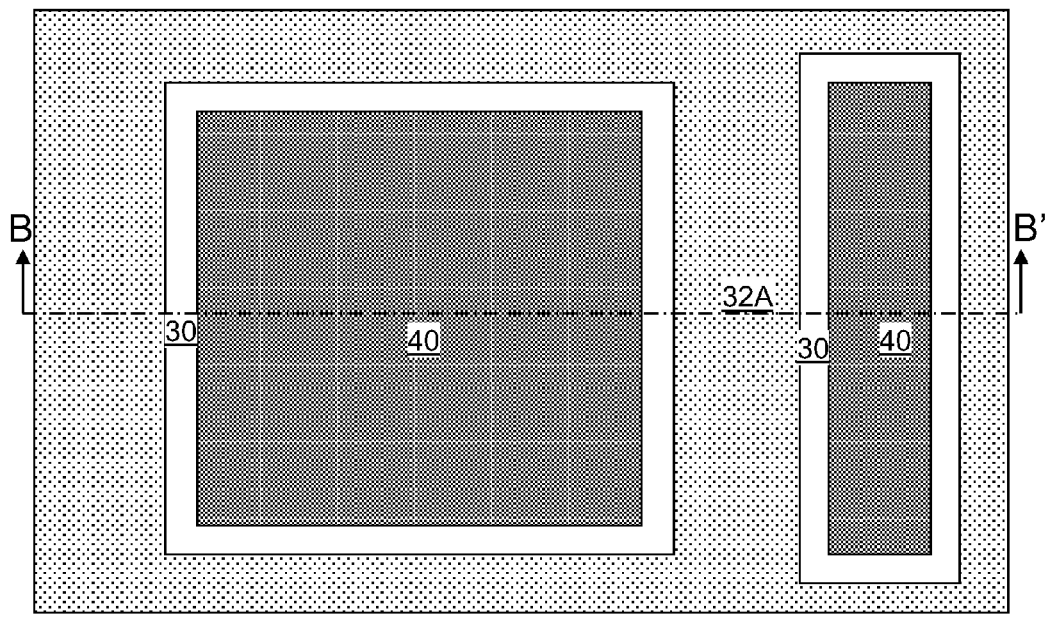
FIG. 3A is a top-down view of the exemplary structure after a pull back of the hard mask portions according to an embodiment of the present disclosure.
Figure 3B:
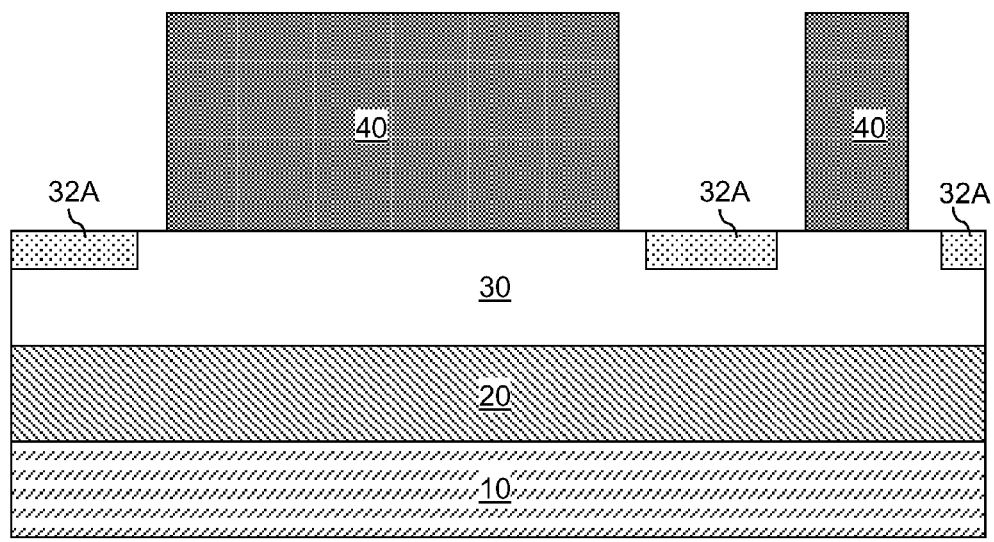
FIG. 3B is a vertical cross-sectional view of the exemplary structure along the vertical plane B-B' of FIG. 3A.

Referring to FIGS. 3A and 3B, the hard mask portions 40 are isotropically etched, for example, by a wet etch or a vapor phase etch. The physically exposed surfaces of the hard mask portions 40 are pulled back isotropically, i.e., move away from the position prior to the etch toward a center sub-portion of each hard mask portion 40 by the isotropic etch. The chemistry of the isotropic etch can be selected such that the material of the hard mask portions 40 is removed without substantially removing the metal in the metal layer 30 or the dielectric metal-containing compound in the first dielectric metal-containing compound portion 32A.

In one embodiment, the hard mask portions 40 can include silicon oxide, and the isotropic etch can employ hydrofluoric acid-based etch chemistry. In another embodiment, the hard mask portions 40 can include silicon nitride, and the isotropic etch can employ an etch chemistry based on hot phosphoric acid. In yet another embodiment, the hard mask portions 40 can include a dielectric metal oxide, and the isotropic etch can employ an etch chemistry for etching the dielectric metal oxide as known in the art. All lateral surfaces and top surfaces of the hard mask portions 40 are recessed during the isotropic etch.

Top surfaces of the metal layer 30 are physically exposed after the physically exposed surfaces of the hard mask portions 40 are isotropically recessed by the isotropic etch. Each surface portion of the metal layer 30 located directly beneath the physically exposed top surfaces of the metal layer 30 is herein referred to as a second surface portion of the metal layer 30. In one embodiment, an outer periphery of each second surface portion coincides with an inner periphery of the first dielectric metal-containing compound portion 32A.

The distance of lateral recess of the hard mask portions 40 is the same irrespective of location of the physically exposed surfaces of the hard mask portions 40. Thus, each second surface portion of the metal layer 30 has a same width throughout. In one embodiment, the width of each second surface portion of the metal layer 30 can be from 1 nm to 100 nm, although lesser and greater widths can also be employed. The width of the second surfaces portions of the metal layer 30 is not limited by any lithographic capabilities of available lithography tools because the width is determined by the etch rate and the duration of the etch process employed to recess the physically exposed surfaces of the hard mask portions 40.

Figure 4A:
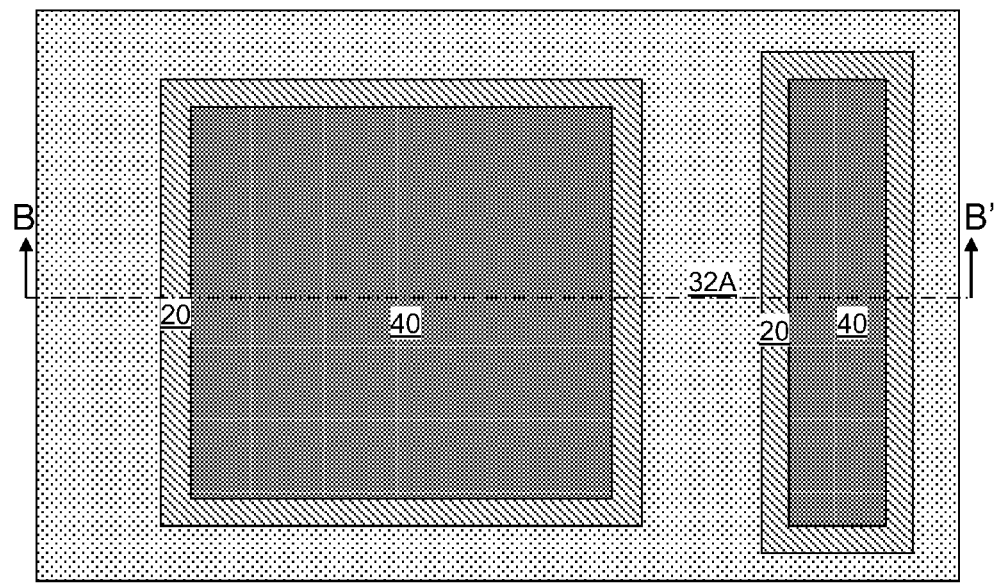
FIG. 4A is a top-down view of the exemplary structure after formation of trenches through the metal layer according to an embodiment of the present disclosure.
Figure 4B:
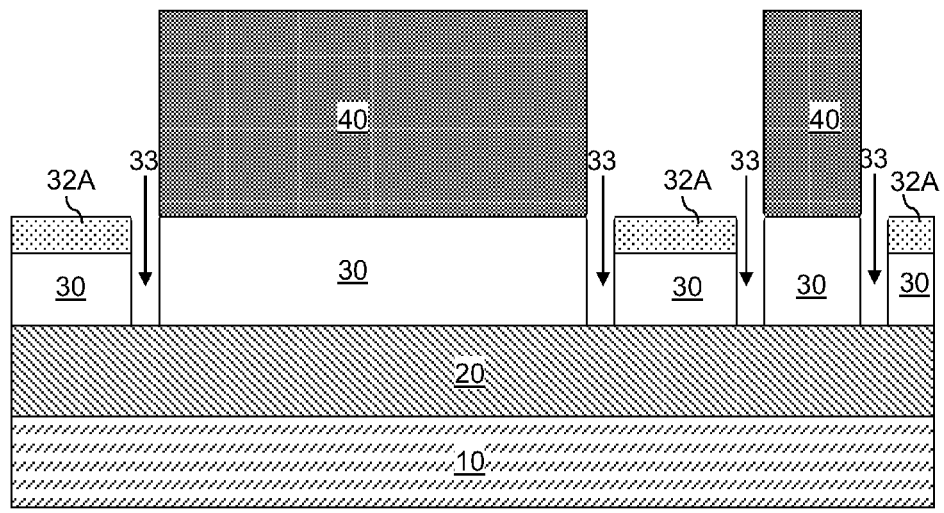
FIG. 4B is a vertical cross-sectional view of the exemplary structure along the vertical plane B-B' of FIG. 4A.

Referring to FIGS. 4A and 4B, first trenches 33 are formed through the metal layer 30 by anisotropically etching the second surface portions and the portions of the metal layer 30 that underlie the second surface portions employing the first dielectric metal-containing compound portion 32A and the hard mask portions 40 as etch masks. The first trenches 33 are formed through the metal layer 30 within the area of the second surface portions of the metal layer 30, which is the area in which top surfaces of the metal layer 30 are physically exposed. The first trenches 33 are formed by an anisotropic etch that removes the metal in the metal layer 30 selective to the dielectric metal-containing compound in the first dielectric metal-containing compound portion 32A and selective to the material of the hard mask portions 40. For example, chlorine-based etch chemistry can be employed to remove the metal in the metal layer 30 selective to the dielectric metal-containing compound of the first dielectric metal-containing compound portion 32A, and selective to the dielectric material of the hard mask portions 40. Etch gases that can be employed for the chlorine-based etch chemistry include, but are not limited to, $Cl_2$, $CCl_4$, $CHCl_3$, $CH_2Cl_2$, and combinations thereof.

In one embodiment, the material of the underlying material layer 20 can be selected to be a material that is resistant to the etch chemistry of the anisotropic etch that forms the first trenches 33. For example, the material at the top surface of the underlying material layer 20 can be a dielectric material such as silicon oxide, silicon nitride, silicon oxynitride, a dielectric metal oxide, a semiconductor material, or a combination thereof.

Figure 5A:
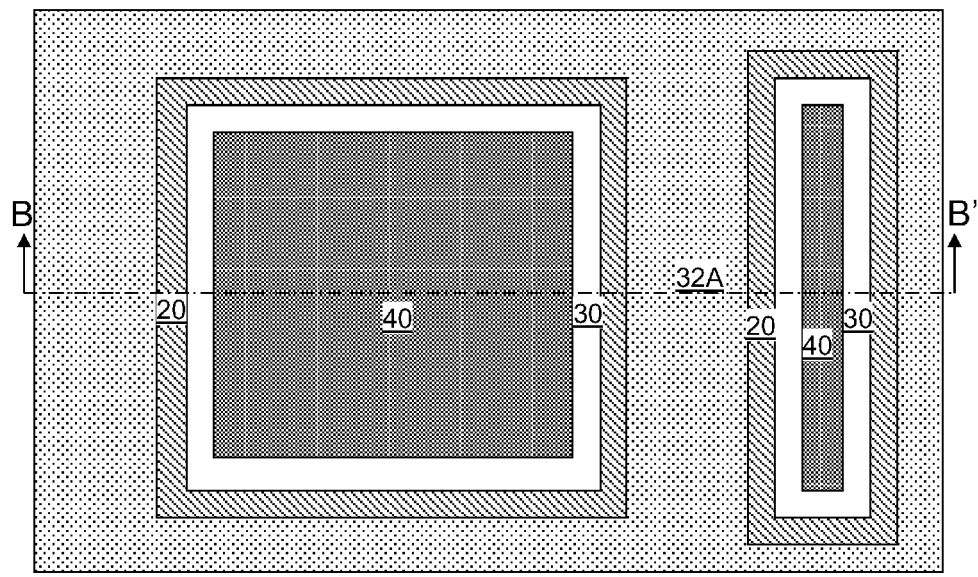
FIG. 5A is a top-down view of the exemplary structure after a pull back of the hard mask portions according to an embodiment of the present disclosure.
Figure 5B:
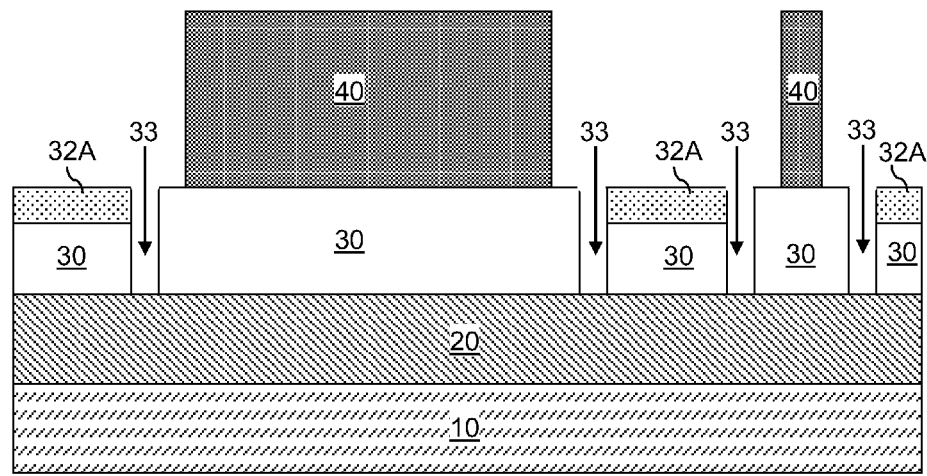
FIG. 5B is a vertical cross-sectional view of the exemplary structure along the vertical plane B-B' of FIG. 5A.

Referring to FIGS. 5A and 5B, the hard mask portions 40 are isotropically etched, for example, by a wet etch or a vapor phase etch. The physically exposed surfaces of the hard mask portions 40 are pulled back isotropically by the isotropic etch. The chemistry of the isotropic etch can be selected such that the material of the hard mask portions 40 is removed without substantially removing the metal in the metal layer 30 or the dielectric metal-containing compound in the first dielectric metal-containing compound portion 32A. In one embodiment, the same etch chemistry can be employed as in the isotropic etch performed in the processing steps of FIGS. 3A and 3B.

Top surfaces of the metal layer 30 are physically exposed after the physically exposed surfaces of the hard mask portions 40 are isotropically recessed by the isotropic etch. Each surface portion of the metal layer 30 located directly beneath the physically exposed top surfaces of the metal layer 30 is herein referred to as a third surface portion of the metal layer 30. In one embodiment, an outer periphery of each third surface portion coincides with an inner periphery of the first trenches 33.

The distance of lateral recess of the hard mask portions 40 is the same irrespective of location of the physically exposed surfaces of the hard mask portions 40. Thus, each third surface portion of the metal layer 30 has a same width throughout. In one embodiment, the width of each third surface portion of the metal layer 30 can be from 1 nm to 100 nm, although lesser and greater widths can also be employed. The width of the third surfaces portions of the metal layer 30 is not limited by any lithographic capabilities of available lithography tools because the width is determined by the etch rate and the duration of the etch process employed to recess the physically exposed surfaces of the hard mask portions 40.

Figure 6A:
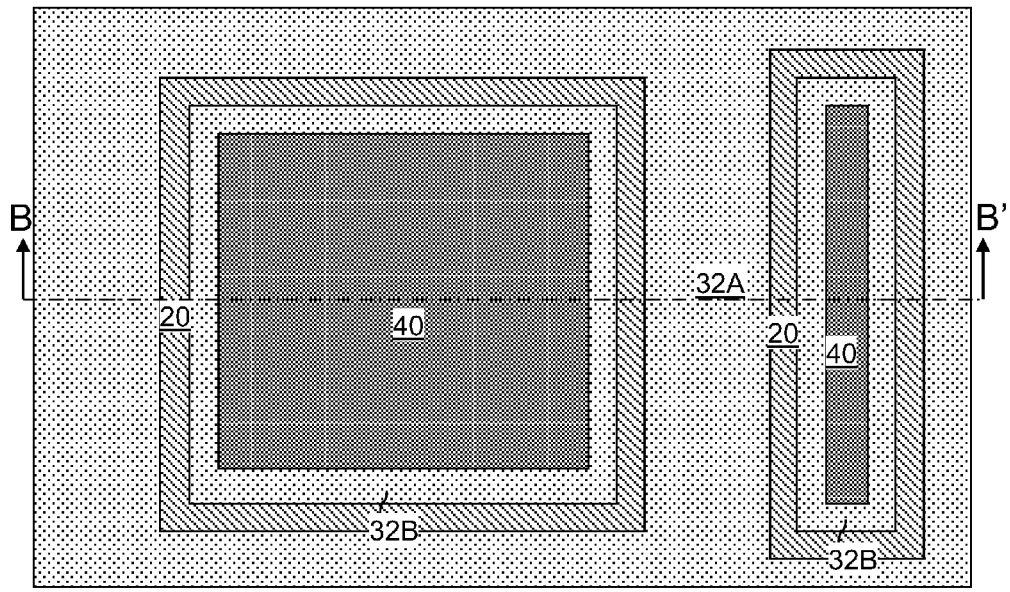
FIG. 6A is a top-down view of the exemplary structure after formation of additional dielectric metal-containing compound portions according to an embodiment of the present disclosure.
Figure 6B:
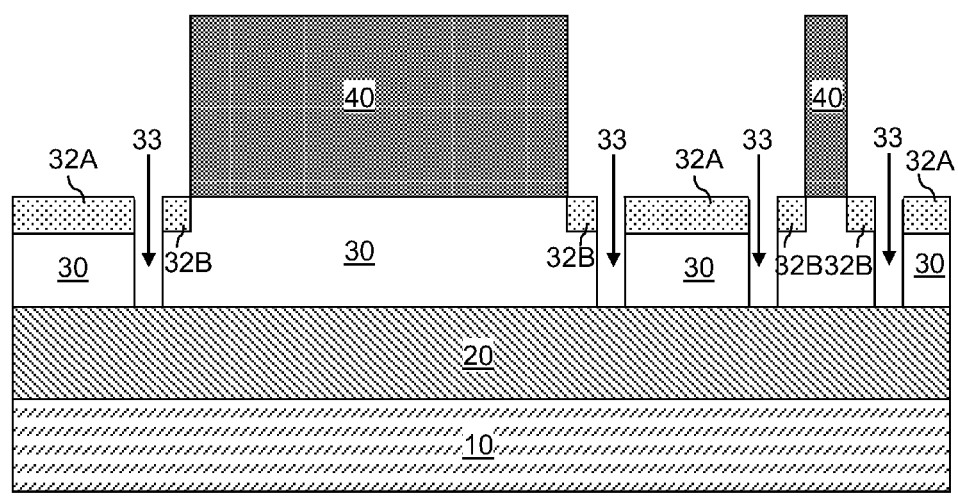
FIG. 6B is a vertical cross-sectional view of the exemplary structure along the vertical plane B-B' of FIG. 6A.

Referring to FIGS. 6A and 6B, the third surface portions of the metal layer 30 are converted into dielectric metal-containing compound portions, which are herein referred to as second dielectric metal-containing compound portions 32B. The conversion of the third surface portions of the metal layer 30 into the second dielectric metal-containing compound portions 32B can be performed employing a plasma conversion process. The hard mask portions 40 can be employed as masking structures that mask the portions of the metal layer 30 underneath the hard mask portions 40 from conversion into a dielectric metal-containing compound material.

In one embodiment, the conversion of the third surface portions of the metal layer 30 into the second dielectric metal-containing compound portions 32B can be performed by plasma oxidation, in which an oxygen-containing plasma oxidizes the third surface portions of the metal layer 30 into a metal oxide material. The processing parameters of the plasma oxidation process can be the same as the plasma oxidation process that can be employed at the processing steps of FIGS. 2A and 2B.

In another embodiment, the conversion of the third surface portions of the metal layer 30 into the second dielectric metal-containing compound portions 32B can be performed by plasma nitridation, in which a nitrogen-containing plasma nitridates the third surface portions of the metal layer 30 into a metal nitride material. The processing parameters of the plasma nitridation process can be the same as the plasma nitridation process that can be employed at the processing steps of FIGS. 2A and 2B.

In yet another embodiment, the conversion of the third surface portions of the metal layer 30 into the second dielectric metal-containing compound portions 32B can be performed by plasma oxynitridation, in which a plasma containing oxygen and nitrogen converts the third surface portions of the metal layer 30 into a metal oxynitride material. The processing parameters of the plasma oxynitridation process can be the same as the plasma oxynitridation process that can be employed at the processing steps of FIGS. 2A and 2B.

In one embodiment, the processing parameters of the plasma oxidation, plasma nitridation, or plasma oxynitridation can be selected so that ions of the plasma impinge substantially vertically on the surfaces of the metal layer 30. In this case, the second dielectric metal-containing compound portions 32B can be formed only beneath horizontal surfaces of the metal layer 30.

The exemplary structure illustrated in FIGS. 6A and 6B is a patterned structure including a patterned layer (30, 32A, 32B) located on the underlying material layer 20. The patterned layer (30, 32A, 32B) includes a first stack located within the area of the first dielectric metal-containing compound portion 32A and second stacks laterally spaced from the first stack by a first trench 33. The first stack includes a first metal portion (i.e., the portion of the metal layer 30 that underlies the first dielectric metal-containing compound portion 32A) and the first dielectric metal-containing compound portion 32A contacting a top surface of the first metal portion. Each second stack includes a second metal portion (i.e., a portion of the metal layer 30 that is laterally enclosed by a first trench 33) and a second dielectric metal-containing compound portion 32B overlying a peripheral portion of the second metal portion. Outer sidewalls of each second stack are laterally spaced from inner sidewalls of the first stack by a same distance throughout an entire periphery of each second stack. The lateral spacing is the same for each first trench 33, and is the same as the width of the first trenches 33.

In one embodiment, an inner sub-portion of each second metal portion of the metal layer 30 underlies a hard mask portion 40, and has the same thickness as the stack of the second dielectric metal-containing compound portion 30B and a peripheral portion of the second metal portion 30. In one embodiment, the first stack of the first dielectric metal-containing compound portion 32A and the first metal portion (the underlying portion) of the metal layer 30 has the same thickness as the thickness of the inner sub-portion of the second metal portions of the metal layer 30 throughout an entirety of the first stack. A hard mask portion 40 can overlie an inner sub-portion of each second metal portion of the metal layer 30.

In one embodiment, sidewalls of each hard mask portion 40 can be vertically coincide with a substantially vertical interface between a second metal portion of the metal layer and a second dielectric metal-containing compound portion 32B. As used herein, a first surface of a first element is "vertically coincident" with a second surface of a second element if the first surface and the second surface are within a same vertical plane.

Figure 7A:
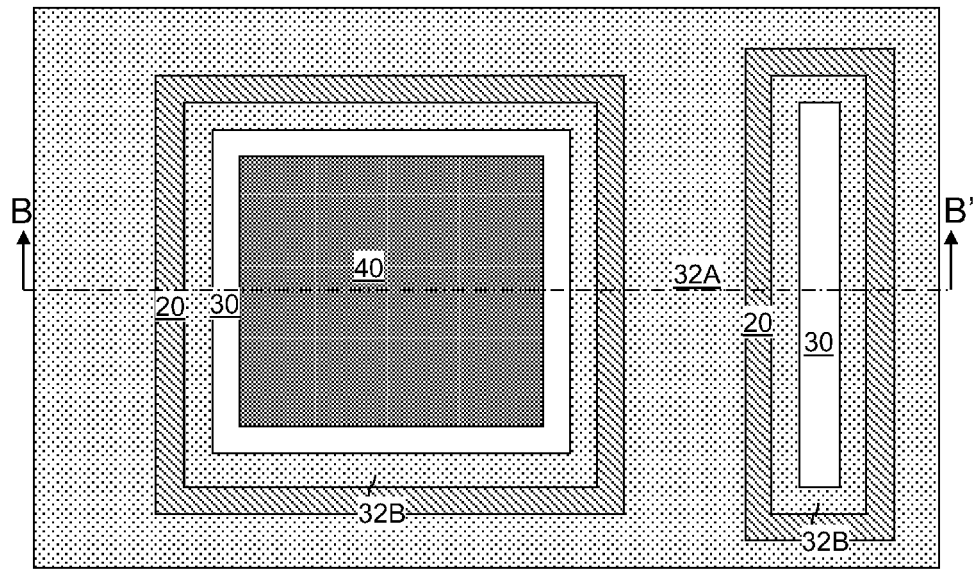
FIG. 7A is a top-down view of the exemplary structure after a pull back of the hard mask portions according to an embodiment of the present disclosure.
Figure 7B:
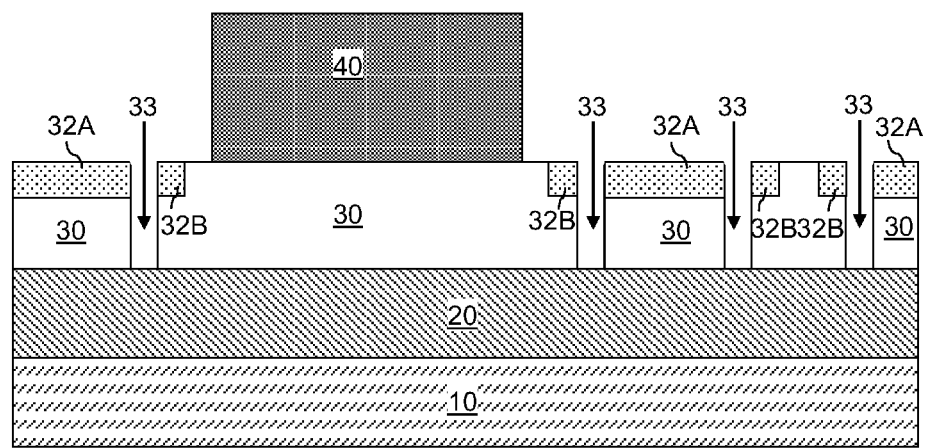
FIG. 7B is a vertical cross-sectional view of the exemplary structure along the vertical plane B-B' of FIG. 7A.

Referring to FIGS. 7A and 7B, the hard mask portions 40 are isotropically etched, for example, by a wet etch or a vapor phase etch. The physically exposed surfaces of the hard mask portions 40 are pulled back isotropically by the isotropic etch. The chemistry of the isotropic etch can be selected such that the material of the hard mask portions 40 is removed without substantially removing the metal in the metal layer 30 or the dielectric metal-containing compound in the first and second dielectric metal-containing compound portions (32A, 32B). In one embodiment, the same etch chemistry can be employed as in the isotropic etch performed in the processing steps of FIGS. 3A and 3B.

Top surfaces the metal layer 30 are physically exposed after the physically exposed surfaces of the hard mask portions 40 are isotropically recessed by the isotropic etch. Each surface portion of the metal layer 30 located directly beneath the physically exposed top surfaces of the metal layer 30 is herein referred to as a fourth surface portion of the metal layer 30. In one embodiment, an outer periphery of each fourth surface portion coincides with an inner periphery of a second dielectric metal-containing compound portion 32B.

The distance of lateral recess of the hard mask portions 40 is the same irrespective of location of the physically exposed surfaces of the hard mask portions 40. Thus, each fourth surface portion of the metal layer 30 can have a same width throughout. In one embodiment, the width of each fourth surface portion of the metal layer 30 can be from 1 nm to 100 nm, although lesser and greater widths can also be employed. The width of each fourth surface portion of the metal layer 30 is not limited by any lithographic capabilities of available lithography tools because the width is determined by the etch rate and the duration of the etch process employed to recess the physically exposed surfaces of the hard mask portions 40.

Figure 8A:
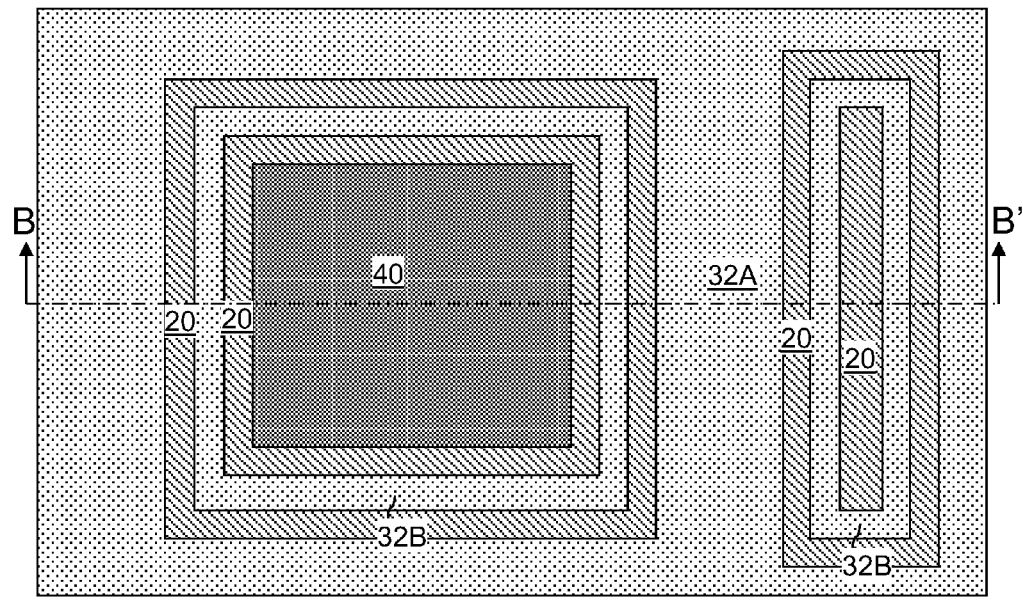
FIG. 8A is a top-down view of the exemplary structure after formation of additional trenches through the metal layer according to an embodiment of the present disclosure.
Figure 8B:
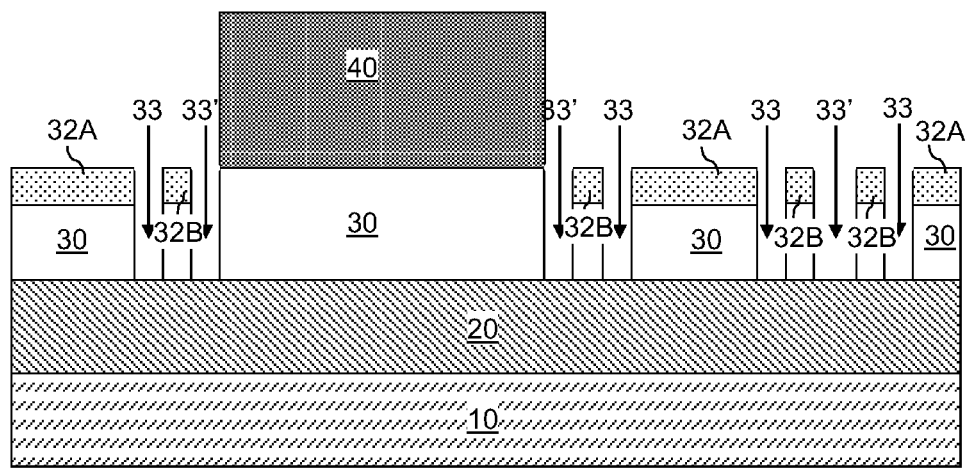
FIG. 8B is a vertical cross-sectional view of the exemplary structure along the vertical plane B-B' of FIG. 8A.

Referring to FIGS. 8A and 8B, second trenches 33' are formed through the metal layer 30 by anisotropically etching the fourth surface portions and the portions of the metal layer 30 that underlie the fourth surface portions employing the first and second dielectric metal-containing compound portions (32A, 32B) and the hard mask portions 40 as etch masks. The second trenches 33' are formed through the metal layer 30 within the area of the fourth surface portions of the metal layer 30, which is the area in which top surfaces of the metal layer 30 are physically exposed. The second trenches 33 are formed by an anisotropic etch that removes the metal in the metal layer 30 selective to the dielectric metal-containing compound in the first and second dielectric metal-containing compound portions (32A, 32B) and selective to the material of the hard mask portions 40. For example, chlorine-based etch chemistry can be employed to remove the metal in the metal layer 30 selective to the dielectric metal-containing compound of the first and second dielectric metal-containing compound portions (32A, 32B), and selective to the dielectric material of the hard mask portions 40.

Figure 9A:
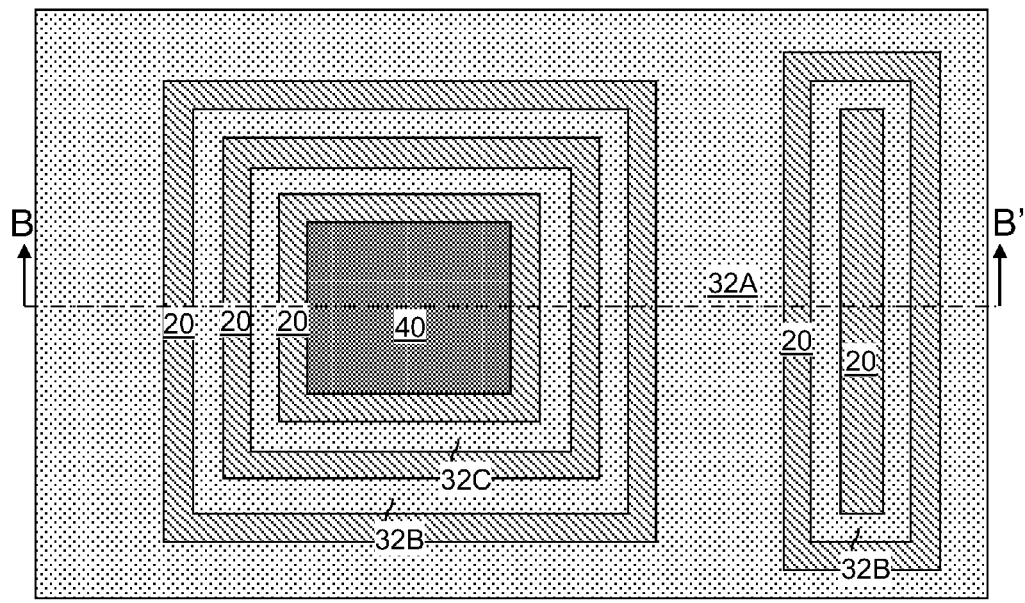
FIG. 9A is a top-down view of the exemplary structure after a sequence of a pull back of the hard mask portions, formation of additional dielectric metal-containing compound portions, another pull back of the hard mask portions, and formation of additional trenches according to an embodiment of the present disclosure.
Figure 9B:
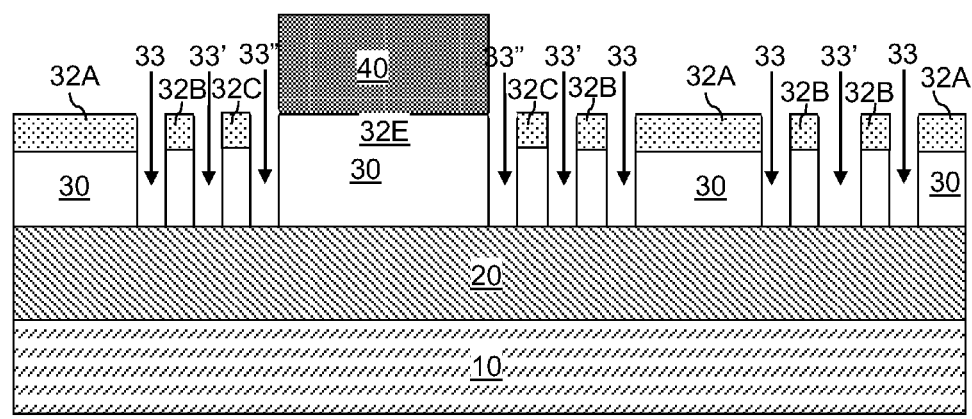
FIG. 9B is a vertical cross-sectional view of the exemplary structure along the vertical plane B-B' of FIG. 9A.

Referring to FIGS. 9A and 9B, a sequence of a pull back of the hard mask portions 40, formation of additional dielectric metal-containing compound portions, another pull back of the hard mask portions 40, and formation of additional trenches can be optionally repeated. Specifically, the step of physically exposing a top surface of an additional surface portion of the metal layer 30 by isotropically recessing physically exposed surfaces of the hard mask portion(s) 40 can be performed employing the same processing steps as the processing steps of FIGS. 5A and 5B. The step of converting the additional surface portion of the metal layer 30 into an additional dielectric metal-containing compound portion (such as a third dielectric metal-containing compound portion 32C) employing the hard mask portion(s) 40 as a masking structure can be performed employing the same processing steps as the processing steps of FIGS. 6A and 6B. The step of physically exposing a top surface of a yet additional surface portion of the metal layer 30 by isotropically recessing physically exposed surfaces of the hard mask portion(s) 30 can be performed employing the same processing steps as the processing steps of FIGS. 7A and 7B. The step of forming an additional trench 33" through the metal layer 30 by anisotropically etching the yet additional surface portion and a portion of the metal layer 30 that underlies the yet additional surface portion can be performed employing the same processing steps as the processing steps of FIGS. 8A and 8B.

Figure 10A:
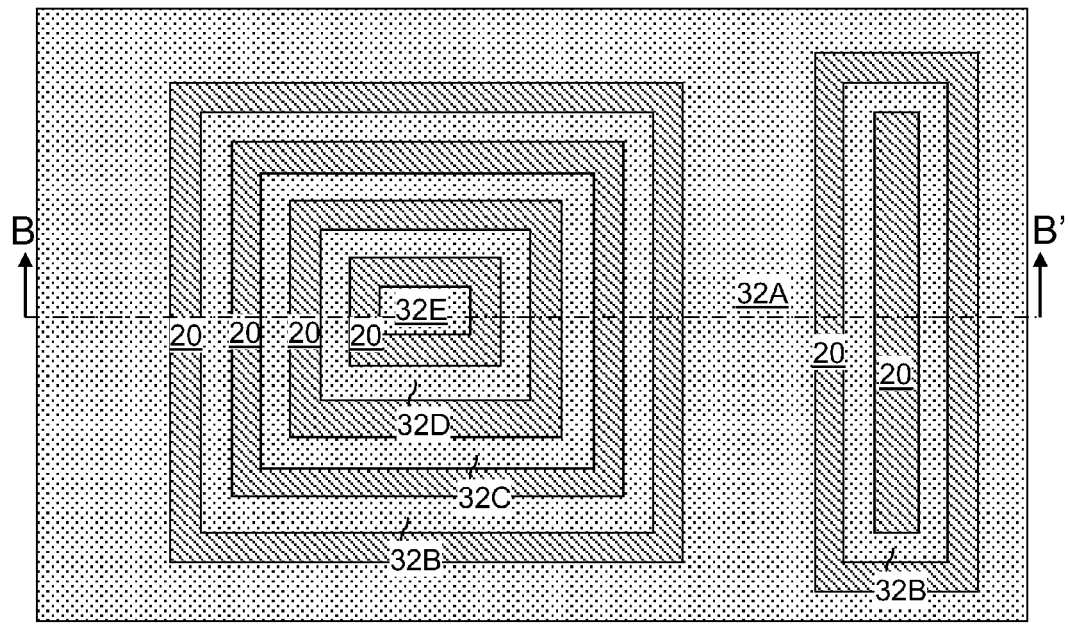
FIG. 10A is a top-down view of the exemplary structure after repeatedly performing the sequence of a pull back of the hard mask portions, formation of additional dielectric metal-containing compound portions, another pull back of the hard mask portions, and formation of additional trenches according to an embodiment of the present disclosure.
Figure 10B:
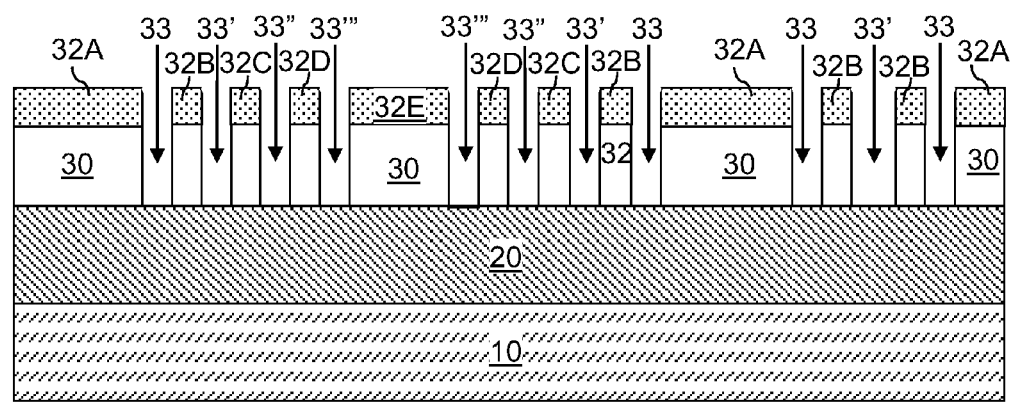
FIG. 10B is a vertical cross-sectional view of the exemplary structure along the vertical plane B-B' of FIG. 10A.

Referring to FIGS. 10A and 10B, the sequence of a pull back of the hard mask portions 40, formation of additional dielectric metal-containing compound portions, another pull back of the hard mask portions 40, and formation of additional trenches as performed at the processing steps of FIGS. 9A and 9B can be optionally repeated as many times as needed or until the hard mask portions 40 are completely consumed by the repeated isotropic etching. Additional trenches 33''' can be formed through the patterned layer including the metal layer 30 and the various dielectric metal-containing compound portions (32A, 32B, 32C, 32D, 32E). The various dielectric metal-containing compound portions (32A, 32B, 32C, 32D, 32E) collectively constitute a dielectric metal-containing compound layer.

Figure 11A:
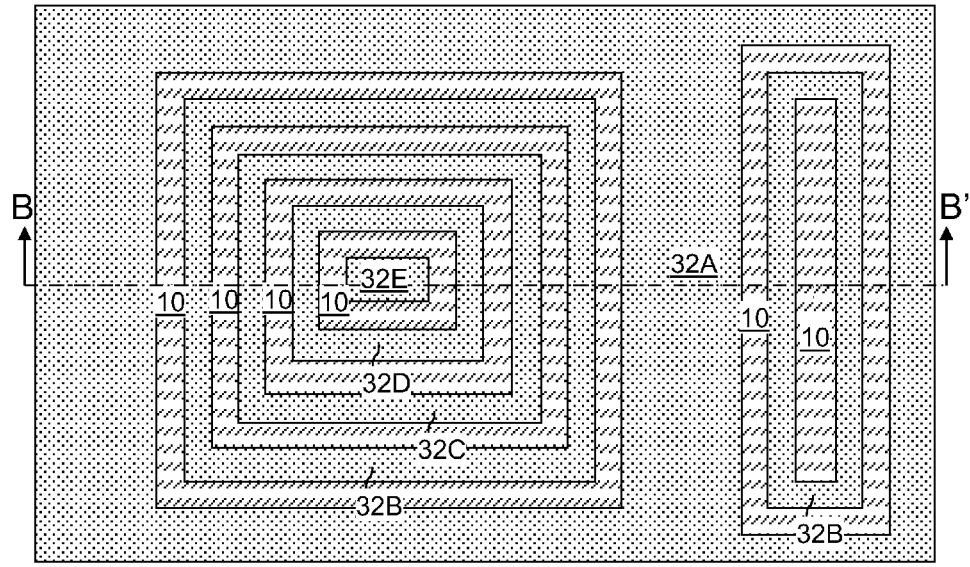
FIG. 11A is a top-down view of the exemplary structure after transfer of the pattern in the metal layer into an underlying material layer by an anisotropic etch according to an embodiment of the present disclosure.
Figure 11B:
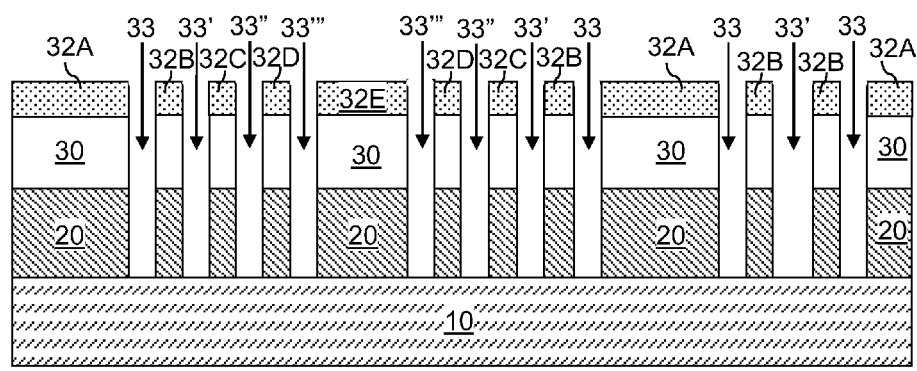
FIG. 11B is a vertical cross-sectional view of the exemplary structure along the vertical plane B-B' of FIG. 11A.

Referring to FIGS. 11A and 11B, the pattern in the patterned layer including the metal layer 30 and the various dielectric metal-containing compound portions (32A, 32B, 32C, 32D, 32E) is transferred into the underlying material layer 20 by an anisotropic etch. The various dielectric metal-containing compound portions (32A, 32B, 32C, 32D, 32E) and/or the metal layer 30 can be employed as an etch mask during the anisotropic etch that transfers the pattern of the various cavities (33, 33', 33", 33''') into the underlying material layer 20. The etch chemistry of the anisotropic etch can be selected so that the material of the underlying material layer 20 can be etched selective to at least one of the dielectric metal-containing compound of the various dielectric metal-containing compound portions (32A, 32B, 32C, 32D, 32E) and the metal of the metal of the metal layer 30. In one embodiment, the anisotropic etch can have an etch chemistry that removes the material of the underlying material layer 20 selective to the dielectric metal-containing compound of the various dielectric metal-containing compound portions (32A, 32B, 32C, 32D, 32E). In another embodiment, the anisotropic etch can have an etch chemistry that removes the material of the underlying material layer 20 selective to the metal of the metal layer 30.

Figure 12A:
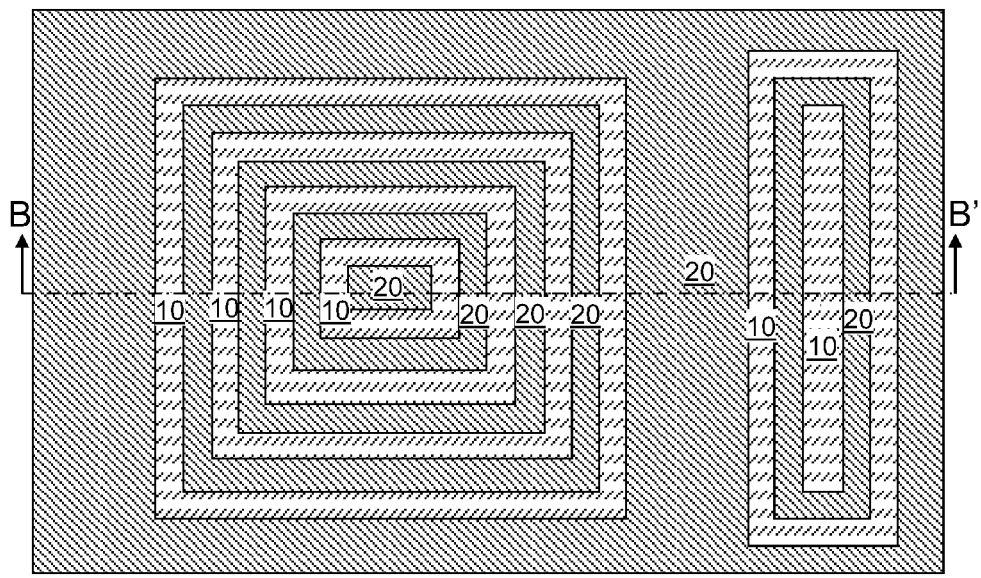
FIG. 12A is a top-down view of the exemplary structure after removal of the dielectric metal-containing compound layer and the metal layer according to an embodiment of the present disclosure.
Figure 12B:
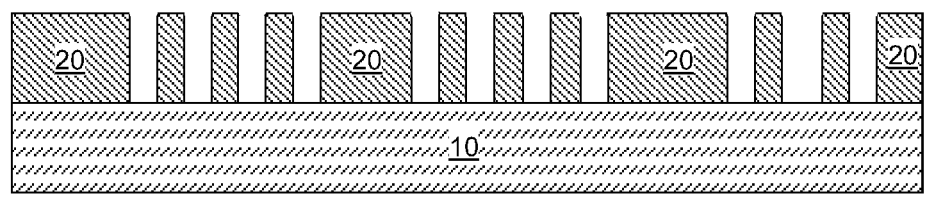
FIG. 12B is a vertical cross-sectional view of the exemplary structure along the vertical plane B-B' of FIG. 12A.

Referring to FIGS. 12A and 12B, the dielectric metal-containing compound portions (32A, 32B, 32C, 32D, 32E) and the metal layer 30 can be removed selective to the underlying material layer 20 by at least one etch, which can include at least one wet etch and/or at least one dry etch. The removal of the dielectric metal-containing compound portions (32A, 32B, 32C, 32D, 32E) can be removed, for example, by an etch that employs a fluorine-based etch chemistry. For example, a dry etch employing $CF_4$, $CHF_3$, and/or $CH_2F_2$ can be employed. Any other etch chemistry that removes the dielectric metal-containing compound portions (32A, 32B, 32C, 32D, 32E) selective to the material of the underlying material layer 20 can also be employed. The metal layer 30 can be removed, for example, by an etch that employs a chlorine-based etch chemistry. For example, a dry etch employing $CCl_4$, $CHCl_3$, and/or $CH_2Cl_2$ can be employed. Any other etch chemistry that removes the metal of the metal layer 30 selective to the material of the underlying material layer 20 can also be employed. Each trench within the underlying material layer 20 has a same width throughout. Multiple trenches that replicate the pattern of trenches that are formed at the same processing step between the processing steps of FIGS. 4A and 4B and the processing steps of FIGS. 11A and 11B.

Figure 13:
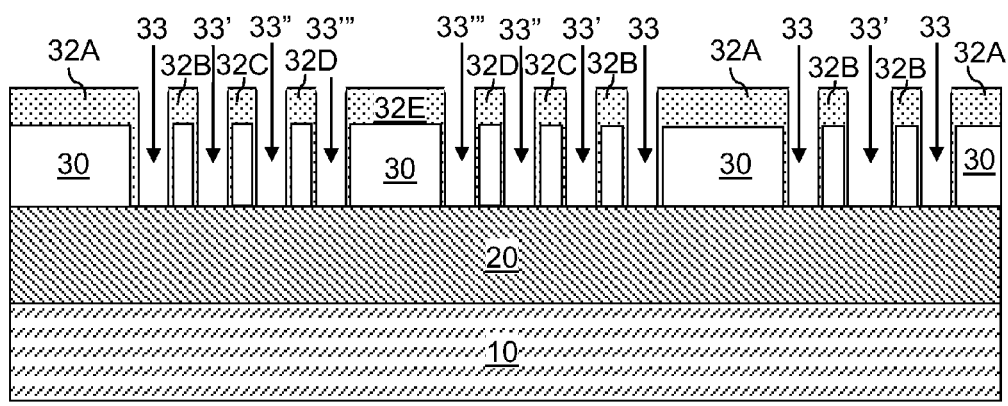
FIG. 13 is a vertical cross-sectional view of a variation of the exemplary structure according to an embodiment of the present disclosure.

Referring to FIG. 13, a variation of the exemplary structure can be derived from the exemplary structure in FIGS. 10A and 10B by changing the processing parameters of the plasma oxidation, plasma nitridation, or plasma oxynitridation that forms the various dielectric metal-containing compound portions (32B, 32C, 32D, 32E). Specifically, the processing parameters of the plasma oxidation, plasma nitridation, or plasma oxynitridation can be selected such that a substantial fraction of the ions of the plasma impinge on the surfaces of the metal layer 30 along non-vertical directions, i.e., directions that are different from the vertical direction. In this case, the various dielectric metal-containing compound portions 32B can be formed on sidewalls of the various trenches (33, 33', 33", 33'''). The processing steps of FIGS. 11A and 11B and the processing steps of FIGS. 12A and 12B can be subsequently performed to provide the same structure as illustrated in FIGS. 12A and 12B.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a patterned structure comprising:
   forming a metal layer on an underlying material layer;
   forming a hard mask portion on said metal layer;
   converting a first surface portion of said metal layer into a dielectric metal-containing compound portion employing said hard mask portion as a masking structure; and
   physically exposing a top surface of a second surface portion of said metal layer by isotropically recessing physically exposed surfaces of said hard mask portion, wherein an outer periphery of said second surface portion coincides with an inner periphery of said dielectric metal-containing compound portion and an inner periphery of said second surface portion coincided with a set of bottom edges of sidewalls of a remaining portion of said hard mask portion that overlies a third surface portion of said metal layer which is laterally bounded by said second surface portion after a process that isotropically recessing physically exposed surfaces of said hard mask portion is terminated.

2. The method of claim 1, wherein said converting of said first surface portion comprises plasma conversion of a metal in said metal layer into a dielectric metal-containing compound.

3. The method of claim 2, wherein said plasma conversion is plasma oxidation and said dielectric metal-containing compound is an oxide of said metal in said metal layer.

4. The method of claim 2, wherein said plasma conversion is plasma nitridation and said dielectric metal-containing compound is a nitride of said metal in said metal layer.

5. The method of claim 2, wherein said metal is selected from aluminum, tantalum, titanium, tungsten, hafnium, zirconium, chromium, copper, zinc, iron, cobalt, and nickel.

6. A method of forming a patterned structure comprising:
   forming a metal layer on an underlying material layer;
   forming a hard mask portion on said metal layer;
   converting a first surface portion of said metal layer into a dielectric metal-containing compound portion employing said hard mask portion as a masking structure; physically exposing a top surface of a second surface portion of said metal layer by isotropically recessing physically exposed surfaces of said hard mask portion, wherein an outer periphery of said second surface portion coincides with an inner periphery of said dielectric metal-containing compound portion; and
   forming a trench through said metal layer by anisotropically etching said second surface portion and a portion of said metal layer that underlies said second surface portion employing said dielectric metal-containing compound portion and said hard mask portion as etch masks.

7. The method of claim 6, further comprising physically exposing a top surface of a third surface portion of said metal layer by isotropically recessing physically exposed surfaces of said hard mask portion after said forming of said trench, wherein an outer periphery of said third surface portion coincides with an inner periphery of said trench.

8. The method of claim 7, further comprising converting said third surface portion of said metal layer into a second dielectric metal-containing compound portion employing said hard mask portion as a masking structure.

9. The method of claim 8, further comprising:
   physically exposing a top surface of a fourth surface portion of said metal layer by isotropically recessing physically exposed surfaces of said hard mask portion, wherein an outer periphery of said fourth surface portion coincides with an inner periphery of said second dielectric metal-containing compound portion; and
   forming another trench through said metal layer by anisotropically etching said fourth surface portion and a portion of said metal layer that underlies said fourth surface portion.

10. The method of claim 6, further comprising performing at least once a sequence of:
   physically exposing a top surface of an additional surface portion of said metal layer by isotropically recessing physically exposed surfaces of said hard mask portion;
   converting said additional surface portion of said metal layer into an additional dielectric metal-containing compound portion employing said hard mask portion as a masking structure;
   physically exposing a top surface of a yet additional surface portion of said metal layer by isotropically recessing physically exposed surfaces of said hard mask portion; and
   forming an additional trench through said metal layer by anisotropically etching said yet additional surface portion and a portion of said metal layer that underlies said yet additional surface portion.

11. The method of claim 6, further comprising transferring a pattern in a dielectric metal-containing compound layer including at least said dielectric metal-containing compound portion into said underlying material layer by an anisotropic etch employing said dielectric metal-containing compound layer as an etch mask.

12. The method of claim 11, further comprising:
   removing said dielectric metal-containing compound layer; and
   removing remaining portions of said metal layer from above said underlying material layer.

13. The method of claim 1, further comprising:
   forming a hard mask layer comprising a material selected from silicon oxide, silicon nitride, silicon oxynitride, and a dielectric metal oxide on said metal layer; and
   patterning said hard mask layer, wherein a remaining portion of said hard mask layer is said hard mask portion.

14. The method of claim 1, further comprising forming a trench through said metal layer by anisotropically etching said second surface portion and a portion of said metal layer that underlies said second surface portion employing said dielectric metal-containing compound portion and said hard mask portion as etch masks.

15. The method of claim 14, further comprising physically exposing a top surface of a sub-portion of said third surface portion of said metal layer by isotropically recessing physically exposed surfaces of said hard mask portion after said forming of said trench, wherein an outer periphery of said sub-portion of said third surface portion coincides with an inner periphery of said trench.

16. The method of claim 14, further comprising transferring a pattern in a dielectric metal-containing compound layer including at least said dielectric metal-containing compound portion into said underlying material layer by an anisotropic etch employing said dielectric metal-containing compound layer as an etch mask.

17. The method of claim 6, wherein said converting of said first surface portion comprises plasma conversion of a metal in said metal layer into a dielectric metal-containing compound.

18. The method of claim 17, wherein said plasma conversion is plasma oxidation and said dielectric metal-containing compound is an oxide of said metal in said metal layer.

19. The method of claim 17, wherein said plasma conversion is plasma nitridation and said dielectric metal-containing compound is a nitride of said metal in said metal layer.

20. The method of claim 17, wherein said metal is selected from aluminum, tantalum, titanium, tungsten, hafnium, zirconium, chromium, copper, zinc, iron, cobalt, and nickel.

* * * * *